(12) United States Patent
Danilov et al.

(10) Patent No.: US 10,719,250 B2
(45) Date of Patent: *Jul. 21, 2020

(54) SYSTEM AND METHOD FOR COMBINING ERASURE-CODED PROTECTION SETS

(71) Applicant: EMC IP Holding Company LLC, Hopkinton, MA (US)

(72) Inventors: Mikhail Danilov, Saint Petersburg (RU); Kirill Gusakov, Saint Petersburg (RU)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 59 days.

This patent is subject to a terminal disclaimer.

(21) Appl. No.: 16/024,314

(22) Filed: Jun. 29, 2018

(65) Prior Publication Data

US 2020/0004447 A1    Jan. 2, 2020

(51) Int. Cl.
*G06F 3/06* (2006.01)
*H03M 13/47* (2006.01)
*G06F 16/901* (2019.01)

(52) U.S. Cl.
CPC ............ *G06F 3/0638* (2013.01); *G06F 3/067* (2013.01); *G06F 3/0631* (2013.01); *G06F 16/901* (2019.01); *H03M 13/47* (2013.01)

(58) Field of Classification Search
CPC .... G06F 3/0638; G06F 16/901; G06F 3/0631; G06F 3/067; H03M 13/47
See application file for complete search history.

(56) References Cited

U.S. PATENT DOCUMENTS

| | | |
|---|---|---|
| 5,675,802 A | 10/1997 | Allen et al. |
| 5,805,788 A | 9/1998 | Johnson |
| 7,389,393 B1 | 6/2008 | Karr et al. |
| 8,370,542 B2 | 2/2013 | Lu et al. |
| 8,495,465 B1 * | 7/2013 | Anholt .................. H03M 13/29 714/763 |

(Continued)

OTHER PUBLICATIONS

Non-Final Office Action received for U.S. Appl. No. 15/651,504 dated Mar. 21, 2019, 10 pages.

(Continued)

*Primary Examiner* — Thien Nguyen
(74) *Attorney, Agent, or Firm* — Amin, Turocy & Watson, LLP

(57) ABSTRACT

Resource-efficient data protection is performed by generating meta chunks in storage systems that utilize erasure coding. During erasure coding with a k+m configuration, a data chunk can be divided into k data fragments, having indices 1 to k, that can be encoded by combining them with corresponding coefficients of a coding matrix, to generate coding fragments. Source portions that have a reduced set (e.g., less than k data fragments) of data fragments and that are complementary (e.g., that do not have common indices) can be determined and combined to generate a meta chunk. The coding fragments of the source portions can be added to generate coding fragments for the meta chunk, which can then be utilized to recover data fragments of any of the source portions. Further, the coding fragments, that were previously generated by individually encoding each source portion, can be deleted.

20 Claims, 11 Drawing Sheets

(56) References Cited

U.S. PATENT DOCUMENTS

| | | | |
|---|---|---|---|
| 8,832,234 | B1 | 9/2014 | Brooker et al. |
| 8,972,478 | B1 | 3/2015 | Storer et al. |
| 9,063,838 | B1 | 6/2015 | Boyle et al. |
| 9,641,615 | B1 | 5/2017 | Robins et al. |
| 10,055,145 | B1 | 8/2018 | Danilov et al. |
| 10,361,810 | B2* | 7/2019 | Myung ............ H03M 13/05 |
| 10,503,611 | B1 | 12/2019 | Srivastav et al. |
| 2002/0166026 | A1 | 11/2002 | Ulrich et al. |
| 2005/0140529 | A1 | 6/2005 | Choi et al. |
| 2006/0047896 | A1 | 3/2006 | Nguyen et al. |
| 2006/0075007 | A1 | 4/2006 | Anderson et al. |
| 2006/0143508 | A1 | 6/2006 | Mochizuki et al. |
| 2007/0239759 | A1 | 10/2007 | Shen et al. |
| 2008/0320061 | A1 | 12/2008 | Aszmann et al. |
| 2009/0259882 | A1 | 10/2009 | Shellhamer |
| 2010/0031060 | A1 | 2/2010 | Chew et al. |
| 2010/0218037 | A1 | 8/2010 | Swartz et al. |
| 2010/0332748 | A1 | 12/2010 | Van der Goot et al. |
| 2011/0138148 | A1 | 6/2011 | Friedman et al. |
| 2011/0246503 | A1 | 10/2011 | Bender et al. |
| 2012/0023291 | A1 | 1/2012 | Zeng et al. |
| 2012/0191901 | A1 | 7/2012 | Norair |
| 2012/0204077 | A1* | 8/2012 | D'Abreu ............ G06F 11/1012 714/755 |
| 2012/0317234 | A1 | 12/2012 | Bohrer et al. |
| 2013/0054822 | A1 | 2/2013 | Mordani et al. |
| 2013/0088501 | A1 | 4/2013 | Fell |
| 2013/0097470 | A1 | 4/2013 | Hwang et al. |
| 2013/0246876 | A1 | 9/2013 | Manssour et al. |
| 2014/0064048 | A1 | 3/2014 | Cohen et al. |
| 2014/0280375 | A1 | 9/2014 | Rawson et al. |
| 2014/0297955 | A1 | 10/2014 | Yamazaki et al. |
| 2014/0380088 | A1 | 12/2014 | Bennett et al. |
| 2014/0380125 | A1 | 12/2014 | Calder et al. |
| 2015/0370656 | A1 | 12/2015 | Tsafrir et al. |
| 2016/0011935 | A1 | 1/2016 | Luby |
| 2016/0011936 | A1 | 1/2016 | Luby |
| 2016/0055054 | A1 | 2/2016 | Patterson, III et al. |
| 2016/0162378 | A1 | 6/2016 | Garlapati et al. |
| 2016/0328295 | A1 | 11/2016 | Baptist et al. |
| 2016/0357649 | A1 | 12/2016 | Karrotu et al. |
| 2016/0371145 | A1 | 12/2016 | Akutsu et al. |
| 2016/0380650 | A1 | 12/2016 | Calder et al. |
| 2017/0003880 | A1 | 1/2017 | Fisher et al. |
| 2017/0102993 | A1* | 4/2017 | Hu ..................... G06F 11/1068 |
| 2017/0206025 | A1 | 7/2017 | Viswanathan |
| 2017/0206135 | A1 | 7/2017 | Zeng |
| 2017/0262187 | A1 | 9/2017 | Manzanares et al. |
| 2018/0063213 | A1* | 3/2018 | Bevilacqua-Linn ........................ H04L 65/605 |
| 2018/0129417 | A1 | 5/2018 | Sivasubramanian et al. |
| 2018/0181324 | A1 | 6/2018 | Daniliv et al. |
| 2018/0181612 | A1 | 6/2018 | Daniliv et al. |
| 2018/0267856 | A1 | 9/2018 | Hayasaka et al. |
| 2018/0341662 | A1 | 11/2018 | He |
| 2019/0028179 | A1* | 1/2019 | Kalhan ............... H04B 7/15521 |
| 2019/0065310 | A1 | 2/2019 | Rozas |
| 2019/0205437 | A1 | 7/2019 | Larson et al. |
| 2019/0384500 | A1 | 12/2019 | Danilov et al. |
| 2019/0386683 | A1 | 12/2019 | Danilov et al. |

OTHER PUBLICATIONS

Non-Final Office Action received for U.S. Appl. No. 15/662,273 dated Nov. 16, 2018, 19 pages.
Final Office Action received for U.S. Appl. No. 15/662,273 dated May 15, 2019, 33 pages.
Non-Final Office Action received for U.S. Appl. No. 15/965,479 dated Apr. 15, 2019, 21 pages.
Non-Final Office Action received for U.S. Appl. No. 15/794,950 dated Jul. 9, 2019, 29 pages.
Final Office Action received for U.S. Appl. No. 15/651,504 dated Sep. 18, 2019, 15 pages.
Non-Final Office Action received for U.S. Appl. No. 15/952,179 dated Sep. 10, 2019, 42 pages.
"Standard Raid Levels—RAID 6" Wikipedia. [https://en.wikipedia.org/wiki/Standard_RAID_levels#RAID_6], retrieved Oct. 18, 2019, 11 pages.
Non-Final Office Action received for U.S. Appl. No. 15/656,382 dated Nov. 1, 2019, 47 pages.
Final Office Action received for U.S. Appl. No. 15/952,179 dated Nov. 26, 2019, 53 pages.
Non-Final Office Action received for U.S. Appl. No. 16/177,278 dated Dec. 2, 2019, 55 pages.
Non-Final Office Action received for U.S. Appl. No. 15/651,504 dated Dec. 31, 2019, 18 pages.
Non-Final Office Action received for U.S. Appl. No. 16/010,246 dated Dec. 5, 2019, 67 pages.
Stonebreaker et al. "Distributed RAID—A New Multiple Copy Algorithm.", IEEE ICDE, 1990, pp. 430-437.
Muralidhar et al. "f4: Facebook's Warm BLOB Storage System", USENIX. OSDI, Oct. 2014, pp. 383-398.
Non-Final Office Action received for U.S. Appl. No. 16/010,255 dated Jan. 9, 2020, 31 pages.
Office Action dated Feb. 5, 2020 for U.S. Appl. No. 16/261,551, 30 pages.
Non-Final Office Action received for U.S. Appl. No. 16/228,612 dated Feb. 27, 2020, 49 pages.
Final Office Action received for U.S. Appl. No. 16/010,246 dated Mar. 16, 2020, 33 pages.
Final Office Action received for U.S. Appl. No. 15/656,382 dated Apr. 6, 2020, 31 pages.
Non-Final Office Action received for U.S. Appl. No. 15/582,167 dated Sep. 7, 2018, 19 pages.
Non-Final Office Action received for U.S. Appl. No. 15/952,179 dated Apr. 20, 2020, 68 pages.
Notice of Allowance dated May 4, 2020 for U.S. Appl. No. 16/240,193, 46 pages.
Office Action dated May 11, 2020 for U.S. Appl. No. 16/177,278, 53 pages.
Office Action dated May 8, 2020 for U.S. Appl. No. 16/231,018, 78 pages.
Notice of Allowance dated May 11, 2020 for U.S. Appl. No. 16/240,193, 24 pages.

* cited by examiner

SYSTEM AND METHOD FOR COMBINING ERASURE-CODED PROTECTION SETS

TECHNICAL FIELD

The subject disclosure relates generally to storage systems. More specifically, this disclosure relates to various embodiments for combining erasure-coded protection sets.

BACKGROUND

The large increase in amount of data generated by digital systems has created a new set of challenges for data storage environments. Traditional storage area network (SAN) and/or network-attached storage (NAS) architectures have not been designed to support data storage and/or protection at large multi-petabyte capacity levels. Object storage technology can be utilized to meet these requirements. By utilizing object storage technology, organizations can not only keep up with rising capacity levels, but can also store these new capacity levels at a manageable cost point.

Typically, a scale-out, cluster-based, shared-nothing object storage that employs a microservices architecture pattern, for example, an Elastic Cloud Storage (ECS™) can be utilized as a storage environment for a new generation of workloads. ECS™ utilizes the latest trends in software architecture and development to achieve increased availability, capacity use efficiency, and performance. ECS™ uses a specific method for disk capacity management, wherein disk space is partitioned into a set of blocks of fixed size called chunks. User data is stored in these chunks and the chunks are shared. One chunk can comprise fragments of several user objects. Chunk content is modified in an append mode. When chunks become full, they are sealed and the content of sealed chunks is immutable. Oftentimes, chunks can comprise a reduced set of data fragments. This increases capacity overheads on data protection and there are some cases when the overheads may be unreasonably high.

The above-described background relating to ECS™ is merely intended to provide a contextual overview of some current issues, and is not intended to be exhaustive. Other contextual information may become further apparent upon review of the following detailed description.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its sole purpose is to present some concepts of the specification in a simplified form as a prelude to the more detailed description that is presented in this disclosure.

Example systems and methods, and other embodiments, disclosed herein relate to facilitating capacity management in distributed storage systems. In one example embodiment, a system is disclosed that comprises a processor and a memory that stores executable instructions that, when executed by the processor, facilitate performance of operations. Moreover, the operations comprise selecting source chunks stored within a storage system that are determined to have fewer than a defined number of data fragments, wherein the source chunks are divided into indexed data fragments, and wherein the indexed data fragments are erasure-coded to generate source coding fragments. Further, operations comprise based on combining the source chunks, generating a meta chunk and in response to verifying that the source chunks do not have data fragments with a common index, adding the source coding fragments to generate combined coding fragments associated with the meta chunk.

Another example embodiment of the specification relates to a method that comprises selecting, by a system comprising a processor, source chunks from chunks of an object storage system, wherein the source chunks are determined to have fewer data fragments than remaining of the chunks other than the source chunks, wherein the data fragments do not have common indices that are utilized for erasure coding the data fragments, and wherein the erasure coding the data fragments results in generation of source coding fragments. The method further comprises determining a meta chunk that represents a combination of the data fragments and based on a summation of the source coding fragments, determining combined coding fragments for the source chunks at a meta chunk level, wherein the combined coding fragments are to be employed to recover at least a portion of the data fragments during a failure condition.

Another example embodiment of the specification relates to a computer-readable storage medium comprising instructions that, in response to execution, cause a computing node device comprising a processor to perform operations, comprising encoding chunks of data stored in an object storage system, wherein the chunks comprise data fragments that have been assigned respective indices, and wherein the encoding comprises combining, based on the respective indices, the data fragments with corresponding encoding coefficients to generate respective coding fragments. Further, the operations comprise combining a group of the chunks to generate a meta chunk, wherein the group of the chunks are determined not to have more than a defined number of data fragments, and wherein the group of the chunks are determined not to have data fragments having common indices. In addition, the operations comprise based on a summation of a group of the coding fragments that correspond to the group of the chunks, determining meta chunk coding fragments that are to be employed to recover at least a portion of the group of the chunks during a failure condition.

The following description and the drawings set forth certain illustrative aspects of the specification. These aspects are indicative, however, of but a few of the various ways in which the principles of the specification may be employed. Other advantages and novel features of the specification will become apparent from the detailed description of the specification when considered in conjunction with the drawings.

DETAILED DESCRIPTION

Figure 1:
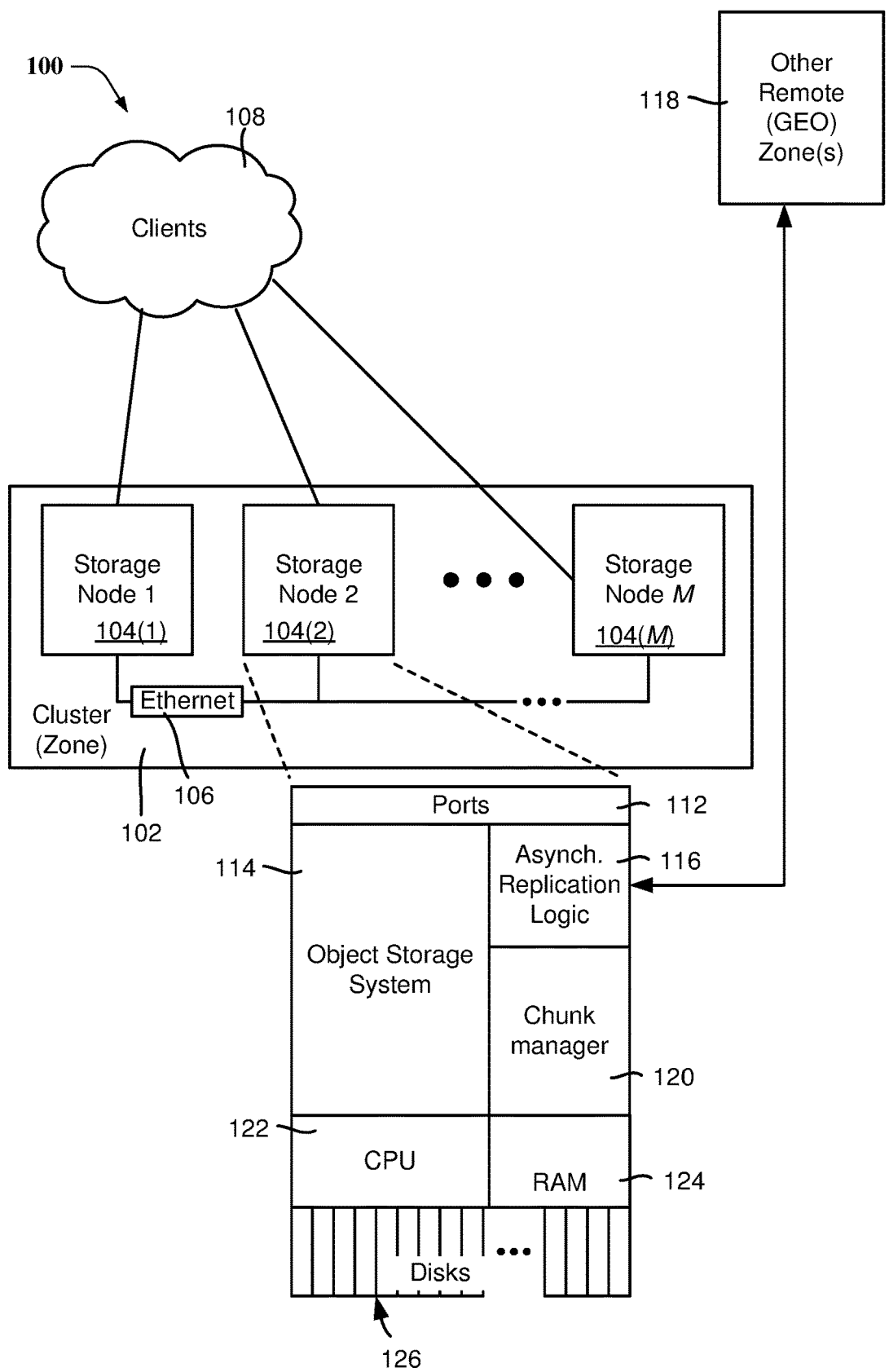
FIG. 1 illustrates an example cloud data storage system comprising that facilitates combining erasure-coded protection sets during meta chunk generation, according to one or more example implementations.

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details, e.g., without applying to any particular networked environment or standard. In other instances, well-known structures and devices are shown in block diagram form in order to facilitate describing the embodiments in additional detail.

The term "cloud" as used herein can refer to a cluster of nodes (e.g., set of network servers), for example, within a distributed object storage system, that are communicatively and/or operatively coupled to each other, and that host a set of applications utilized for servicing user requests. In general, the cloud computing resources can communicate with user devices via most any wired and/or wireless communication network to provide access to services that are based in the cloud and not stored locally (e.g., on the user device). A typical cloud-computing environment can include multiple layers, aggregated together, that interact with each other to provide resources for end-users.

Example systems and methods disclosed herein, in one or more embodiments, relate to cloud storage systems that utilize erasure coding for data protection, such as, but not limited to an elastic cloud storage (ECS™) platform. The ECS™ platform combines the cost advantages of commodity infrastructure with the reliability, availability and serviceability of traditional arrays. In one aspect, the ECS™ platform can comprise a cluster of nodes (also referred to as "cluster" herein) that delivers scalable and simple public cloud services with the reliability and/or control of a private-cloud infrastructure. Moreover, the ECS™ platform comprises a scale-out, cluster-based, shared-nothing object storage, which employs a microservices architecture pattern. The ECS™ platform can support storage, manipulation, and/or analysis of unstructured data on a massive scale on commodity hardware. As an example, ECS™ can support mobile, cloud, big data, content-sharing, and/or social networking applications. ECS™ can be deployed as a turnkey storage appliance or as a software product that can be installed on a set of qualified commodity servers and/or disks. The ECS™ scale-out and geo-distributed architecture is a cloud platform that can provide at least the following features: (i) lower cost than public clouds; (ii) unmatched combination of storage efficiency and data access; (iii) anywhere read/write access with strong consistency that simplifies application development; (iv) no single point of failure to increase availability and performance; (v) universal accessibility that eliminates storage silos and inefficient extract, transform, load (ETL)/data movement processes; etc.

In an aspect, ECS™ does not rely on a file system for disk capacity management. Instead, ECS™ partitions disk space into a set of blocks of fixed size called chunks (e.g., having a chunk size of 128 MB). All user data is stored in these chunks and the chunks are shared. Typically, a chunk can comprise fragments of several different user objects. The chunk content can be modified in an append-only mode. When a chunk becomes full, it can be sealed and the content of a sealed chunk is immutable. Further, ECS™ does not employ traditional data protection schemes like mirroring or parity protection. Instead, ECS™ utilizes erasure coding for data protection. A chunk can be divided into indexed portions (e.g., data fragments), for example, by a chunk manager. An index of a data fragment can be a numerical value assigned by the chunk manager and utilized for erasure coding. Moreover, the index of a data fragment can be utilized to determine a coefficient, within an erasure coding matrix (e.g., the index can be utilized to determine a row and/or column of the matrix), which is to be combined (e.g., multiplied) with the data fragment to generate a corresponding coding fragment for the chunk. Although the systems and methods disclosed herein have been described with respect to object storage systems (e.g., ECS™), it is noted that the subject specification is not limited to object storage systems and can be utilized for most any storage systems that utilize erasure coding for data protection and chunks for disk capacity management. Thus, any of the embodiments, aspects, concepts, structures, functionalities or examples described herein are non-limiting, and the technology may be used in various ways that provide benefits and advantages in computing and data storage in general.

Oftentimes erasure-coded storage systems create a data protection unit (e.g., meta chunk), which combines two or more source chunks having a reduced sets of data fragments, to increase capacity use efficiency without verification and data copying. However, generation of this data protection unit requires complete data re-protection. In other words, an encoding operation (e.g., erasure coding operation) has to be performed using all/combined data fragments of the meta chunk to generate new coding fragments. This is a very resource-demanding operation, especially for GEO erasure coding. The systems and methods disclosed herein facilitate resource-efficient data protection in storage systems that utilize erasure coding, wherein when two or more complementary data portions are to be combined, their protection sets (e.g., coding fragments) can be united into a combined protection set (e.g., a protection set with greater number of data fragments) via simple summing operation.

FIG. 1 shows part of a cloud data storage system such as ECS™ comprising a zone (e.g., cluster) 102 of storage nodes 104(1)-104(M), in which each node is typically a server configured primarily to serve objects in response to client requests (e.g., received from clients 108). The nodes 104(1)-104(M) can be coupled to each other via a suitable data communications link comprising interfaces and protocols such as, but not limited to, Ethernet block 106.

Clients 108 can send data system-related requests to the cluster 102, which in general is configured as one large object namespace; there may be on the order of billions of objects maintained in a cluster, for example. To this end, a node such as the node 104(2) generally comprises ports 112 by which clients connect to the cloud storage system.

Example ports are provided for requests via various protocols, including but not limited to SMB (server message block), FTP (file transfer protocol), HTTP/HTTPS (hypertext transfer protocol), and NFS (Network File System); further, SSH (secure shell) allows administration-related requests, for example.

Each node, such as the node 104(2), includes an instance of an object storage system 114 and data services. For a cluster that comprises a "GEO" zone of a geographically distributed storage system, at least one node, such as the node 104(2), includes or coupled to reference tracking asynchronous replication logic 116 that synchronizes the cluster/zone 102 with each other remote GEO zone 118. Note that ECS™ implements asynchronous low-level replication, that is, not object level replication. Typically, organizations protect against outages or information loss by backing-up (e.g., replicating) their data periodically. During backup, one or more duplicate or deduplicated copies of the primary data are created and written to a new disk or to a tape, for example within a different zone. The term "zone" as used herein can refer to one or more clusters that is/are independently operated and/or managed. Different zones can be deployed within the same location (e.g., within the same data center) and/or at different geographical locations (e.g., within different data centers).

In general, and in one or more implementations, e.g., ECS™, disk space is partitioned into a set of large blocks of fixed size called chunks; user data is stored in chunks. Chunks are shared, that is, one chunk may contain segments of multiple user objects; e.g., one chunk may contain mixed segments of some number of (e.g., three) user objects.

A chunk manager 120 can be utilized to manage the chunks and their protection (e.g., via erasure coding (EC)). Erasure coding was created as a forward error correction method for binary erasure channel. However, erasure coding can be used for data protection on data storages. During erasure coding (e.g., utilizing a k+m configuration), the chunk manager 120 can partition a piece of data (e.g., chunk) into k data fragments of equal size. During encoding, redundant m coding fragments are created so that the system can tolerate the loss of any m fragments. Typically, the chunk manager 120 can assign indices to the data fragments (and corresponding coding fragments). In an example, an index can be a numerical value (e.g., 1 to k) that is utilized for erasure coding. Moreover, the index of a data fragment can be utilized to determine a coefficient, within an erasure coding matrix, which is to be combined (e.g., multiplied) with the data fragment to generate a corresponding coding fragment for the chunk. For example, an index value can specify a row and/or column of the coefficient within the erasure coding matrix. As an example, the indices can be assigned based on a defined sequence, in a random order, based on a defined criterion (e.g., to increase probability of complementary data fragments), based on operator preferences, etc. The process of coding fragments creation is called encoding. The process of data fragments recovery using available data and coding fragments is called decoding.

In one example embodiment, GEO erasure coding can also be utilized, wherein if a distributed storage 100 is to tolerate the loss of any m zones/clusters/chunks, then GEO erasure coding can begin at each zone by replicating each new chunk to at least m remote zones. As a result, there are m backup copies of each chunk. Typically, there is one primary backup copy, which can be utilized for encoding. Encoding is performed by one zone for primary backup chunks and other zones replicate to it. Once a zone has k primary chunks replicated from different remote zones, the zone can perform encoding using the chunks replicated to it as data fragments. The chunk size is fixed, in ECS™, with padding or other data to complement, wherein the other data is added as needed. The result of encoding is m data portions of a chunk size. They are stored as chunks of a specific type called coding chunks. After encoding is complete, the zone can store one coding chunk locally and move other m−1 coding chunks to remote zones making sure all the k+m data and coding chunks are stored at different zones whenever possible. Afterwards, the primary backup chunks used for encoding and their peer backup chunks at other zones can be deleted.

According to an aspect, the chunk manager 120 can efficiently generate combined data protection sets during consolidating two or more erasure-coded data portions (e.g., normal/source chunks) that have a reduced sets of data fragments. As an example, chunk manager 120 can verify that the two or more erasure-coded data portions are complementary (e.g., do not have data fragments with the same index) and perform a summing operation to combine their corresponding coding fragments to generate a combined protection set. A CPU 122 and RAM 124 are shown for completeness; note that the RAM 124 can comprise at least some non-volatile RAM. The node includes storage devices such as disks 126, comprising hard disk drives and/or solid-state drives. It is noted that the storage devices can comprise volatile memory(s) or nonvolatile memory(s), or both volatile and nonvolatile memory(s). Examples of suitable types of volatile and non-volatile memory are described below with reference to FIG. 10. The memory (e.g., data stores, databases, tables, etc.) of the subject systems and methods is intended to comprise, without being limited to, these and any other suitable types of memory.

Figure 2:
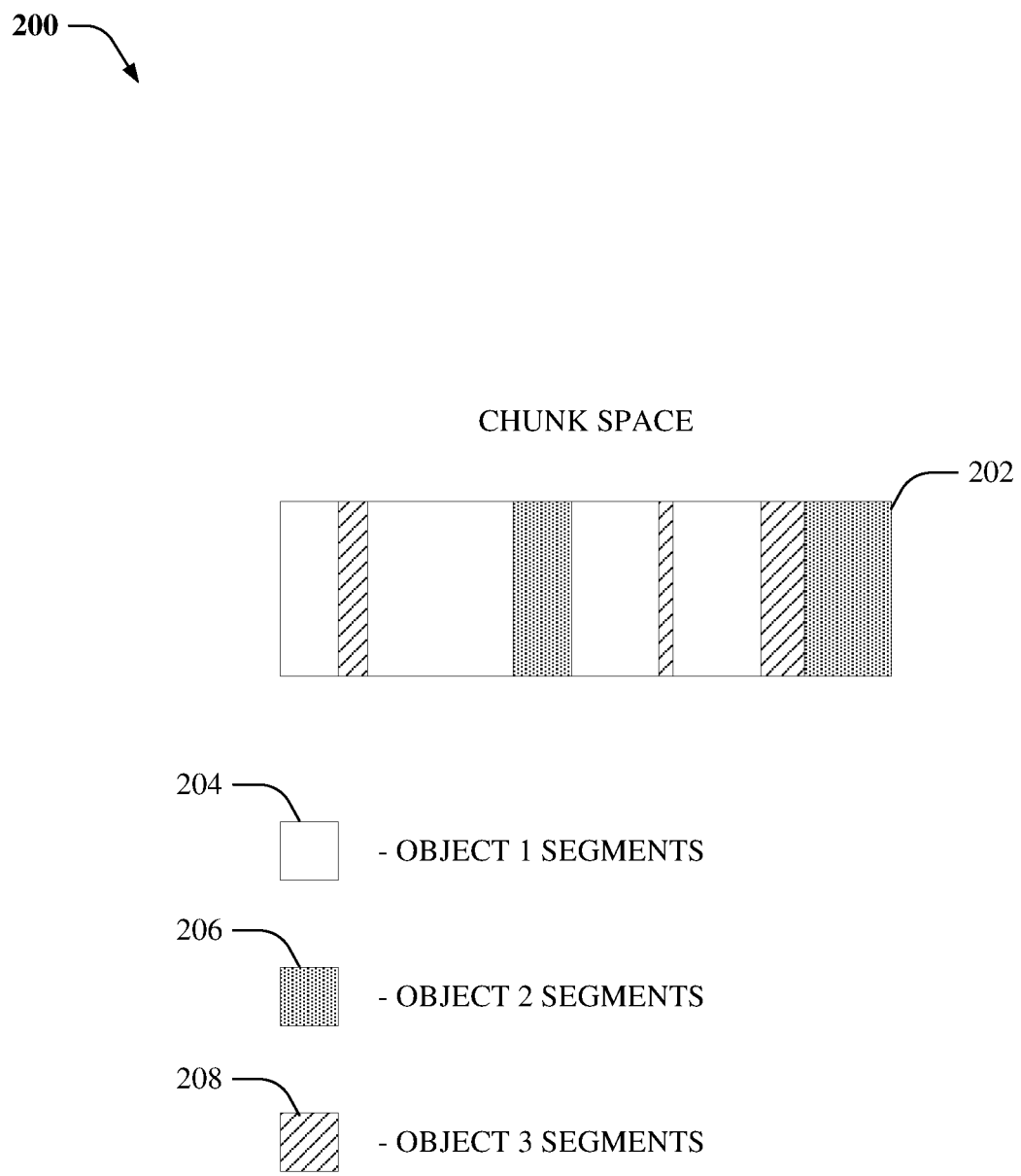
FIG. 2 illustrates an example layout of a chunk within an object storage system in accordance with an aspect of the specification.

FIG. 2 illustrates an example layout 200 of a chunk within an object storage system in accordance with an aspect of the specification. In an aspect, disk space of the object storage system can be partitioned into a set of blocks of fixed size called chunks. As an example, the chunk size can be 128 MB. Typically, user data is stored in these chunks and the chunks are shared. As shown in FIG. 2, a chunk 202 can comprise segments of several user objects (e.g., object 1 segments 204, object 2 segments 206, and object 3 segments 208). It is noted that the chunk layout depicted in FIG. 2. is one example and the chunks can have most any other layout with segments from one or more user objects. Chunk content is modified in an append-only mode. When the chunk becomes full enough, it is sealed. After the chunk is sealed, its content is immutable.

In an aspect, the chunk can be protected by employing erasure coding. During erasure coding, a chunk can be divided into k data fragments of equal size. To encode the chunk, redundant m coding fragments are created so that the system can tolerate the loss of any m fragments. The process of generating the coding fragments is called encoding. The process of data fragments recovery using available data and coding fragments is called decoding. As an example, the encoding operation can be represented with the equation below:

$$C_i = \Sigma_{j=1}^{k} C_{i,j} \tag{1}$$

wherein, $$C_{i,j} = X_{i,j} * D_i \tag{2}$$

and wherein, $X_{i,j}$ is a defined coefficient from a coding matrix (e.g., wherein i, j, and/or k can be most any integer).

Further, j is an index assigned to the data fragment. It is noted that $D_j$ are independent data fragments and $C_i$ are coding fragments.

Additionally, or optionally, the systems and methods disclosed herein can support geographically distributed set-ups (GEO) comprising two or more zones. GEO can be used to provide an additional protection of user data by means of replication. Replication works at the chunk level, wherein a backup copy of a chunk stored in a primary zone can be replicated to one or more secondary zones. Each zone protects the chunks it stores. If a copy of a chunk becomes unavailable, it can be recovered using its other copy. This process is called GEO recovery. In case of GEO erasure coding, remote backup copies of data chunks are used as data fragments and coding fragments created for such data fragments are stored as coding chunks.

Figure 3:
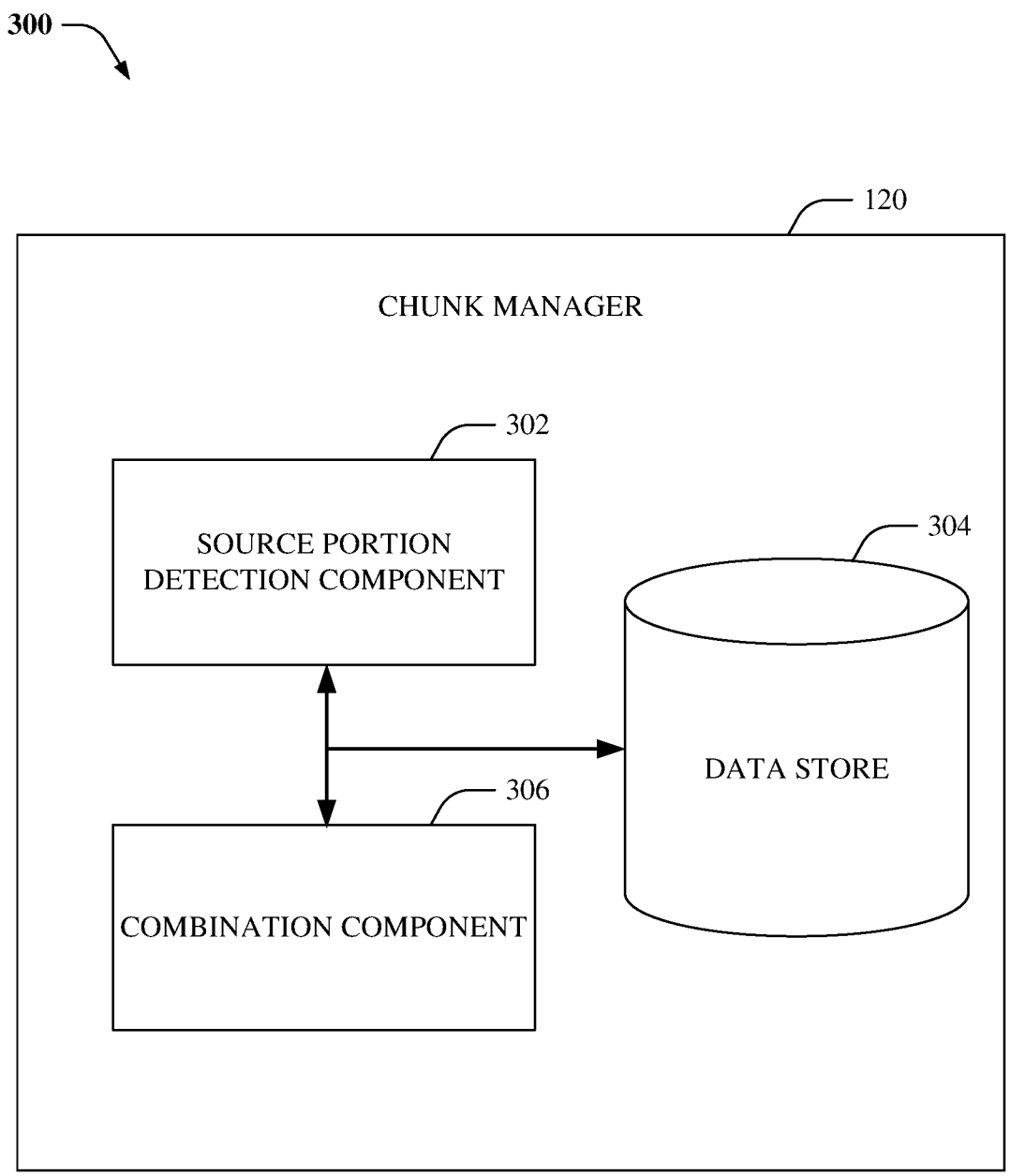
FIG. 3 illustrates an example system for combining protection sets, according to an aspect of the subject disclosure.

Referring now to FIG. 3, there illustrated is an example system 300 for combining protection sets, according to an aspect of the subject disclosure. In one aspect, the chunk manager 120 can efficiently protect chunks, for example, by employing erasure coding (or GEO/distributed erasure coding). As an example, the chunk manager 120 can include functionality as more fully described herein, for example, as described above with regard to system 100. It is noted that the term "data fragment" as used herein can comprise either a traditional data fragment of a chunk (e.g., erasure coding use case) or a data chunk within a zone (e.g., GEO/distributed erasure coding use case); and the term "coding fragment" as used herein can comprise either a traditional coding fragment of a chunk (e.g., erasure coding use case) or a coding chunk within a zone (e.g., GEO/distributed erasure coding use case).

In one aspect, a source portion detection component 302 can be utilized to determine two or more source portions (e.g., comprising data fragments and corresponding coding fragments). As an example, a source portion comprises fewer data fragments than a maximum number (k) of data fragments that can be stored within a chunk. There can be several cases when a portion has fewer than k data fragments. In one example, a data chunk can be sealed before it gets filled. In this example scenario, a storage system stores only one or more (l) first data fragments, the data fragments with user data and the remaining k–l data fragments contain no user data so they are not stored. This scenario is normally a result of a failure or a node restart. As an example, when a storage system survives a period of instability, the system may produce thousands of poorly filled chunks with just one or two data fragments. In another example, a quasi-compacting garbage collection process detects unused blocks within data chunks, reclaims their capacity, and re-uses the freed capacity to create new composite chunks. With the quasi-compacting garbage collection on, chunks degrade gradually. That is, a particular chunk can "lose" its data fragments at its beginning, its end, or in the middle. The number of lost fragments grows with the lapse of time. In yet another example, deletion of data chunks can lead to a situation wherein a protection set created with GEO erasure coding can comprise fewer than k data chunks. Coding chunks from such a protection set are partial coding chunks.

Typically, a data store 304 (e.g., chunk table) can store information about portions/chunks, for example, the number of data fragments stored in each portion/chunk and their indices. The source portion detection component 302 can utilize this information to identify two or more source portions that can be unified to reduce system capacity overheads. As an example, source portion detection component 302 can determine source portions that when combined have k (or fewer than k) data fragments, periodically, on-demand, in response to detecting an event, at a specified time, etc. Further, the source portion detection component 302 can select source portions that determined to be complementary. Two or more data portions are said to complement each other when there is no a pair of data portions that have data fragments with the same index. In other words, for each data fragment index there is one or zero data fragments among all complementary data portions. As an example, indices are assigned to data fragments to facilitate the EC encoding operation, for example, by the chunk manager. Moreover, a coding fragment is generated based on combining (e.g., multiplying) a data fragment with a coding matrix coefficient that is selected based on the index of the data fragment.

In some example embodiments, a probability of having complementary data portions can be increased artificially. Moreover, when a chunk is sealed prematurely, e.g., the chunk manager 120 can assign random indexes to the chunk's data fragments. For example, indexes can be assigned in a range r to r+(l–1), (wherein r can be any integer greater than 1) and so on instead of indexes in a range 1 to l. In one example, r can be randomly selected and/or determined based on an optimization and/or machine learning technique. Additionally, or optionally, the source portion detection component 302 can optimize the source portions selected such that the combined number of data fragments of the portions has the closest value to k. It is noted that a source portion can be a normal chunk or a previously combined portion.

According to an aspect, a combination component 306 can create a combined protection set (e.g., comprising a meta chunk) based on the source portions selected by the source portion detection component 302. It is noted that physical capacity is not allocated for the meta chunk. However, the combination component 306 can create a layout within the newly created data portion (e.g., meta chunk). This layout can map the data fragments of the source portions to the data fragments of the newly created data portion. This mapping can be stored within the data store 304. The creation of the new data portion does not impact data access because data location can still be specified using source portions, which remain the same. This assures an advantage over conventional copying garbage collection. Further, the generation of the new data portion does not require resource-demanding verification procedure. Further, utilization of the new data portion does not require user data location updates.

In one embodiment, the combination component 306 can unite the complementary data portions via a simple summing operation as follows: There are n protection sets for n complementary data portions (e.g., n is an integer greater than 1). Each p-th protection set can be described with an incomplete set of data fragments $\{D_j^p\}$ and a complete set of coding fragments $\{C_i^p\}$. In this example scenario, the union of the protection sets (U) would comprise: (i) a union of n sets of data fragments $\{D_j^p\}$, wherein each data fragment preserves its initial index. The result of this union can be indicated as $\{D_j^U\}$; and (ii) a set of m coding fragments $\{C_i^U\}$, wherein $$C_i^U = \Sigma_{p=1}^n C_i^p \qquad (3)$$

Performing data protection at the level of the combined data portion (e.g., meta chunk) allows reduction of capacity overheads on data protection by n times, where n is a number of normal/source data portions united. Moreover, n*m coding fragments for source data portions are replaced with just m coding fragments of the standard size for a united data portion. Accordingly, system 300 can reduce capacity overheads without complete data re-protection, resulting in a process that is less resource demanding. This is especially advantageous in case of GEO erasure coding, wherein complete data re-protection after meta chunk generation is substantially resource demanding.

Figure 4:
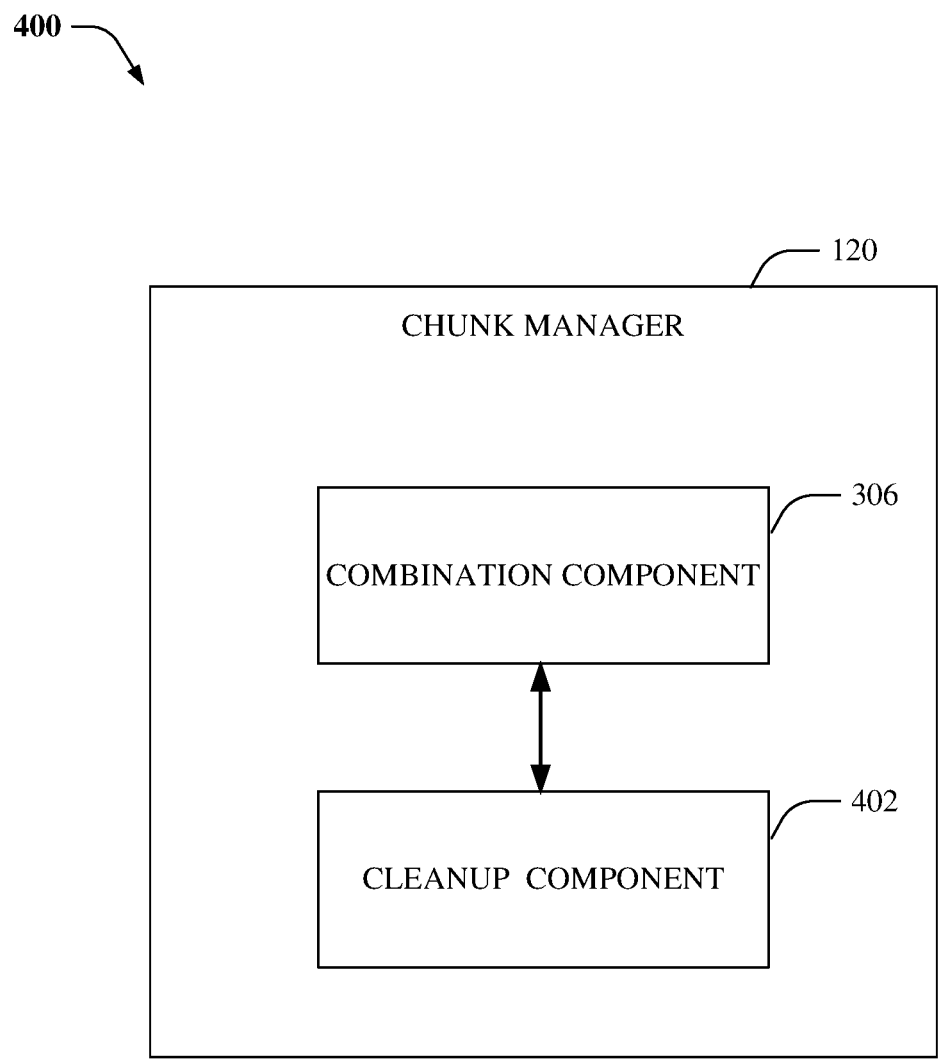
FIG. 4 illustrates an example system that facilitates efficient data protection by employing meta chunks.

FIG. 4 illustrates an example system 400 that facilitates efficient data protection by employing meta chunks. In one aspect, the chunk manager 120 and the combination component 306 can include functionality as more fully described herein, for example, as described above with regard to systems 100 and 300. Typically, erasure coding is utilized for data protection. Moreover, when data is protected with erasure coding, the overheads on data protection are be calculated as m/k. In a situation when a chunk has fewer data fragments (l) the overheads are m/l. Thus, the fewer l, the greater capacity overheads on data protection and there are cases when the overheads may be unreasonably high. Conventional copying garbage collection mechanisms are too slow to make a difference. In contrast, system 400 can efficiently protect complementary data portions that have reduced sets of data fragments (e.g., by employing meta chunks) without complete data re-protection As described in detail supra, the combination component 306 can generate a new meta chunk. In an example, a layout can be created within the new meta chunk that maps the data fragments of the source portions to the data fragments of the new meta chunk. Further, the combination component 306 can combine (e.g., add) the coding fragments of the source portions to generate and store m coding fragments for the new meta chunk. In an aspect, metadata of the source portions (e.g., stored in data store 304) can be updated to reference their meta chunk.

Furthermore, a cleanup component 402 can be utilized to delete coding fragments associated with the source portions (e.g., that were previously generated to protect individual source portions). With reference to equation (3), after the set $\{C_i^U\}$ is generated and saved, the combination component 306 can delete the source sets of coding fragments $\{C_i^P\}$. As an example, for n source portions, the cleanup component 402 can delete n sets of m coding fragments, one set per source portion from the initial set. Source meta chunks (if any) can also be deleted by the cleanup component 402. Performing data protection at the meta chunk level (instead of source chunk level) allows to reduce the capacity overheads by n times, where n is a number of source portions united in one meta chunk. Moreover, n*m previously generated coding fragments for the source portions are replaced with just m coding fragments of the standard size for a meta chunk.

Figure 5:
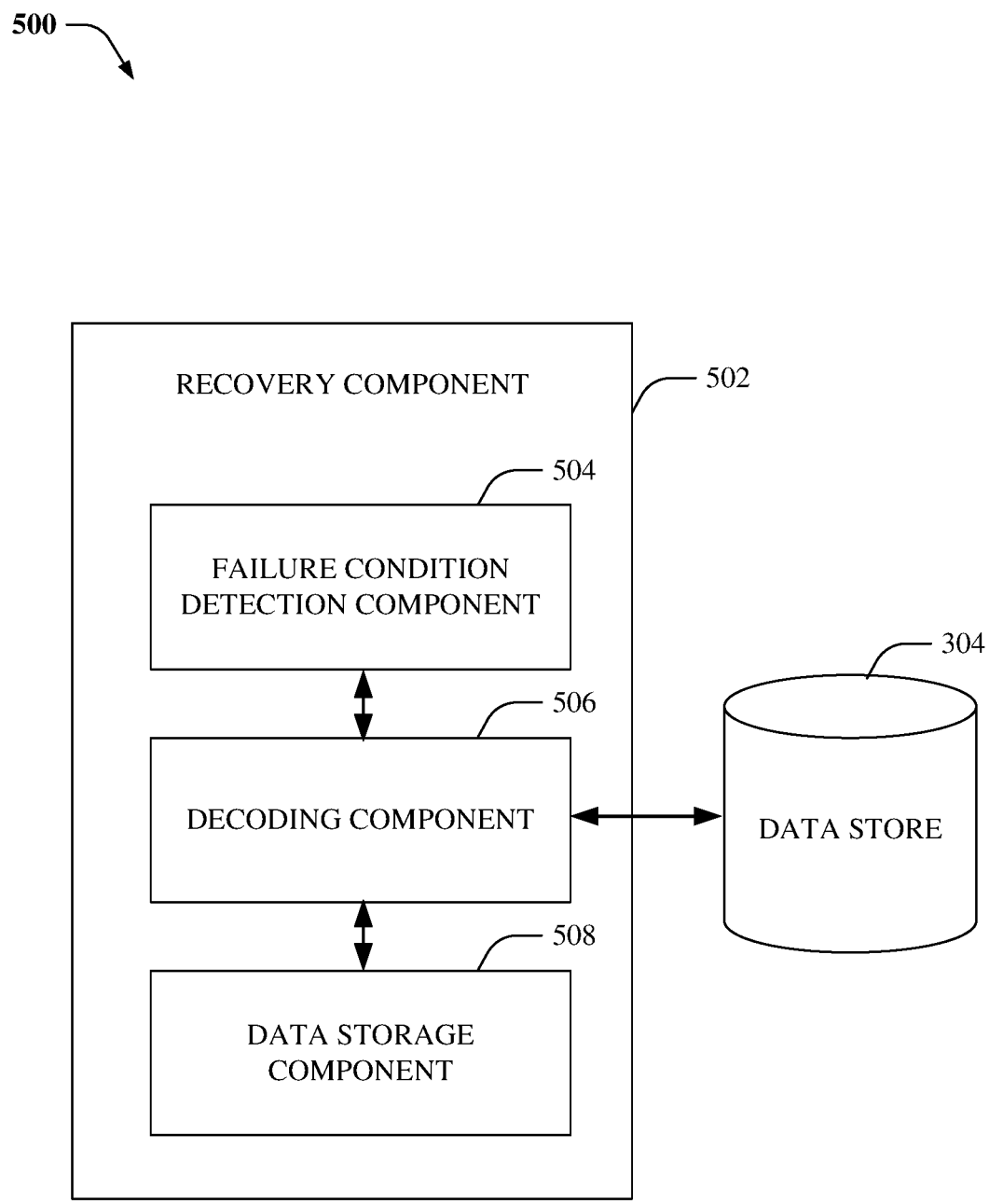
FIG. 5 illustrates an example system that facilitates efficient data recovery by employing meta chunks.

FIG. 5 illustrates an example system 500 that facilitates efficient data recovery by employing meta chunks. In one aspect, a recovery component 502 can be utilized to recover one or more source portions that have been protected at a meta chunk level. It is noted that the data store 304 can include functionality as more fully described herein, for example, as described above with regards to system 300.

In one aspect, a failure detection component 504 can determine that a failure condition has occurred. For example, a failure condition can comprise a loss and/or unavailability of data (e.g., one or more data and/or coding fragments) due to data corruption, hardware failures, data center disasters, natural disasters, malicious attacks, etc. Moreover, the failure detection component 504 can detect the unavailability and/or loss at the source portion level. A decoding component 506 can perform recovery of the data fragment at the meta chunk level. For example, the decoding component 506 can employ a decoding matrix that corresponds to the coding matrix utilized during erasure coding. Further, the decoding component 506 can utilize mapping information (e.g., that maps source portions to a meta chunk) that is, for example, stored within the data store 304, to determine the meta chunk that is to be recovered. The decoding results in a recovery of the data fragments, which can then be stored as a part of its parent source portion (e.g., by employing the data storage component 508).

Figure 6A:
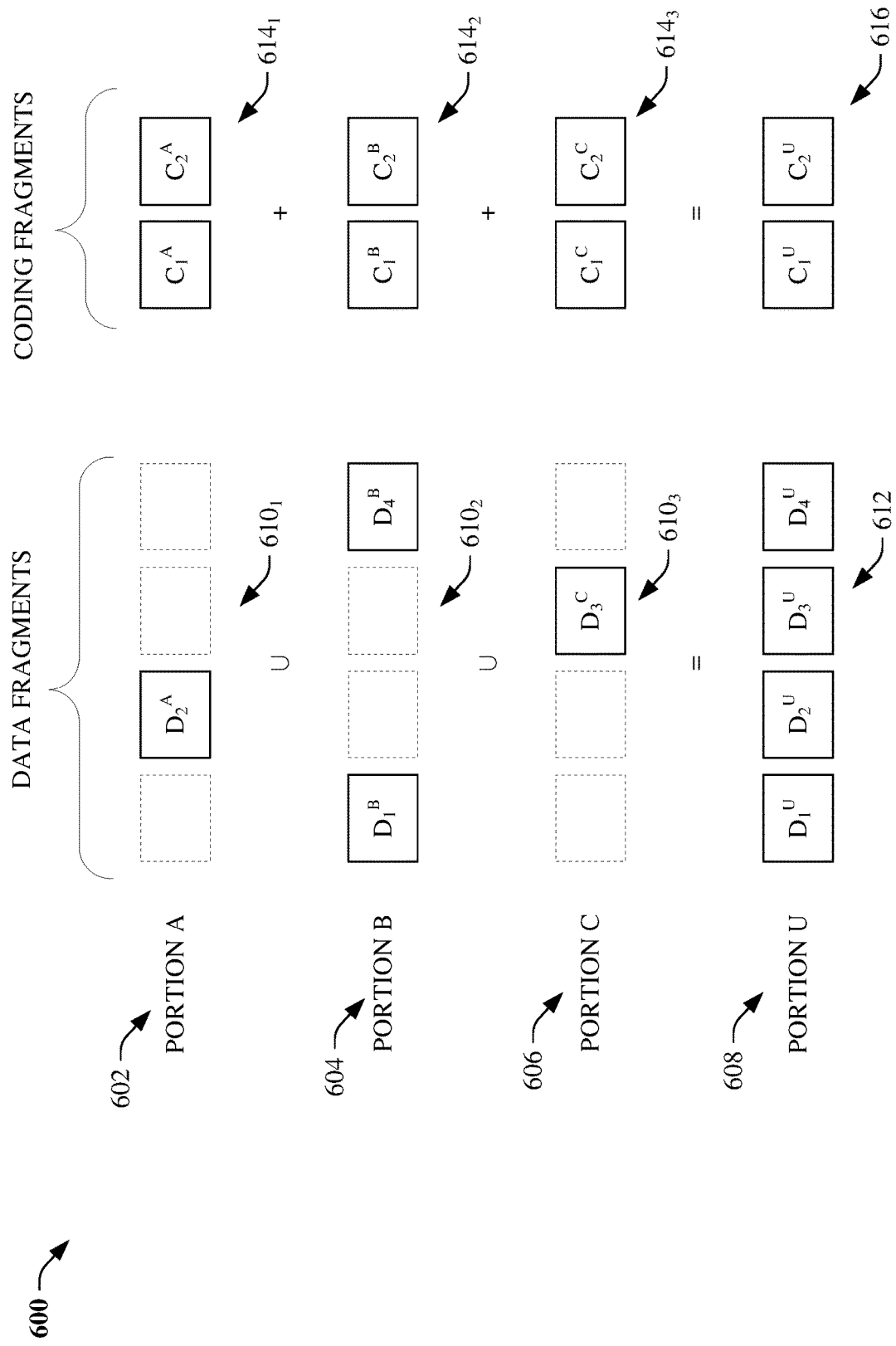
FIGS. 6A-6B depict example embodiments that illustrate a reduction of capacity overheads on data protection without complete data re-protection.
Figure 6B:
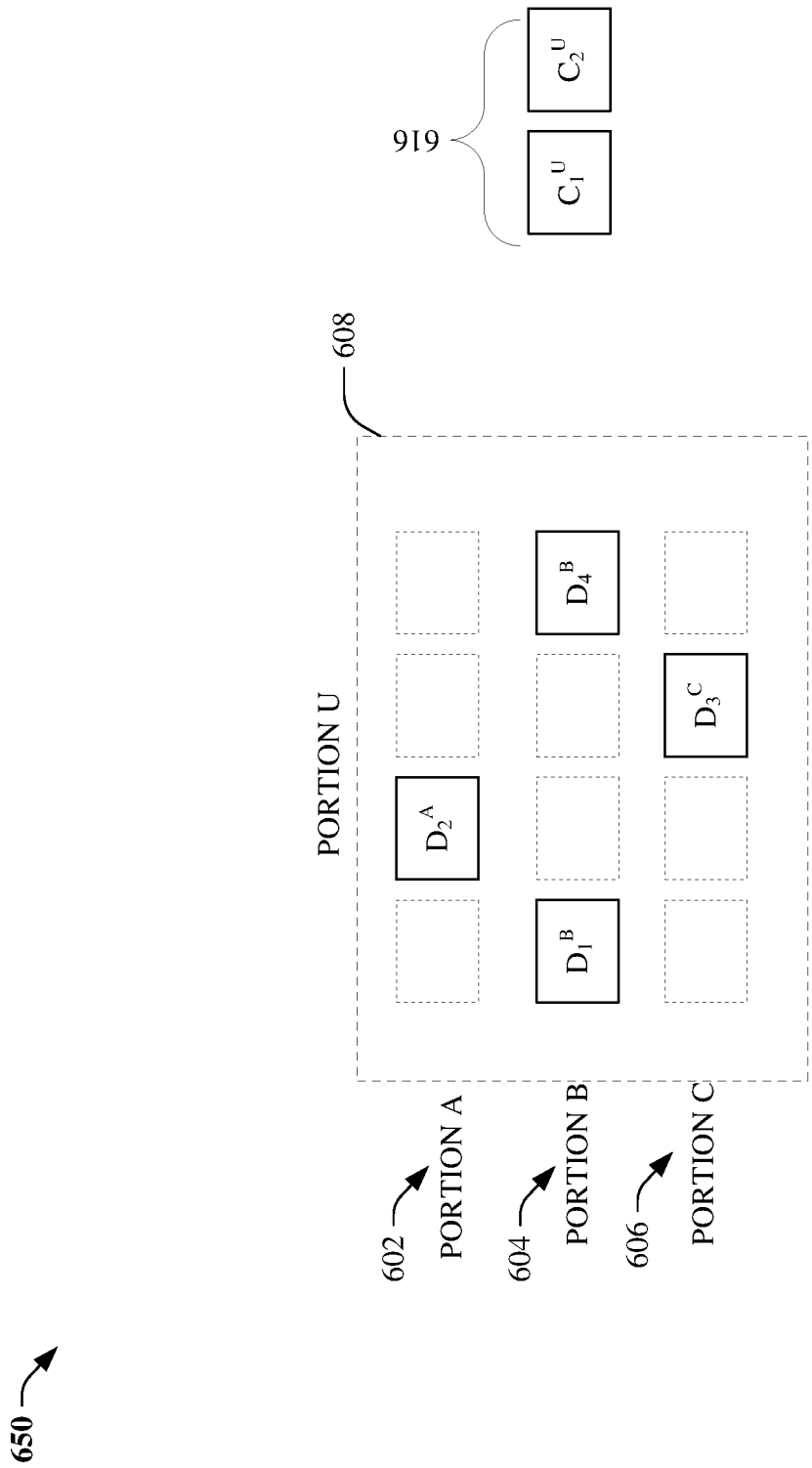

FIGS. 6A-6B depict example embodiments that illustrate reduction of capacity overheads on data protection without complete data re-protection. FIG. 6A illustrates three example portions, portion A 602, portion B 604, and portion C 606, that have a reduced set of data fragments, $610_1$-$610_3$ respectively. Moreover, in this example scenario, a 4+2 (k=4, m=2) erasure coding protection configuration/protocol is applied for data protection and coding fragments $614_1$-$614_3$ are generated for each portion A-C. Although only three portions are depicted, it is noted that the subject disclosure is not limited to three portions with a 4+2 protection configuration, and most any number (greater than 1) of portions with most any erasure coding protection scheme can be utilized.

In this example, portion A 602 comprises one data fragments, $D_2^A$ (e.g., data fragments $D_1^A$, $D_3^A$, and $D_4^A$, can be deleted by a quasi-compacting garbage collector); portion B 604 comprises two data fragments $D_1^B$ and $D_4^B$ (e.g., the portion was sealed prematurely); and portion C 606 comprises one data fragment $D_3^C$ (e.g., the portion was sealed prematurely). Altogether the portions above comprise 4 (k) data fragments and 6 (3*m) coding fragments. The overheads on data protection is 3/2 (6/4) instead of target 1/2 (2/4).

In one aspect, the source portion detection component 302 can determine that the portions A-C are complementary portions. Moreover, any two or more of the portions A-C do not have data fragments with the same index. In other words, for each data fragment index ($D_i$) there is one or zero data fragments among all complementary data portions. For example, portions A-C have only one data fragment $D_1^B$ for index 1; only one data fragment $D_2^A$ for index 2; only one data fragment $D_3^C$ for index 3; and only one data fragment $D_4^B$ for index 4. Accordingly, portions A-C can be combined (e.g., via the combination component 306) into a meta chunk, portion U 608 having data fragments 612. It is noted that the combination does not require transfer and/or processing of the data fragments $610_1$-$610_3$. According to an embodiment, the combination component 306 can add the coding fragments $614_1$-$614_3$ to generate coding fragments 616 for the portion U 608. For example, $C_1^U = C_1^A + C_1^B + C_1^C$ and $C_2^U = C_2^A + C_2^B + C_2^C$.

FIG. 6B illustrates an example final layout of data and coding fragments. Coding fragments 616 can be utilized to protect data fragments within portion U 608 that belong to the three source portions (portion A 602, portion B 604, and portion C 606). The source portions (portion A 602, portion B 604, and portion C 606) can be linked with the portion U 608 (e.g., via metadata stored in the data store 304) and the individual coding fragments $614_1$-$614_3$ created for the source portions can be deleted (e.g., via the cleanup component 402).

Since encoding is performed at meta chunk level, there are four data fragments (k) 608 and two (m) coding fragments 616, the target level of overheads on data protection 1/2 (m/k) can be achieved. Data protection with meta chunks is a lightweight alternative to the copying garbage collector in ECS™. It can increase capacity use efficiency without verification and/or data copying. Although FIGS. 6A-6B depict the generation and encoding of a meta chunk (e.g., portion U 608) subsequent to encoding of individual source portions (portion A 602, portion B 604, and portion C 606), it is noted that the subject disclosure is not so limited and that the source portions can be identified and employed to generate a meta chunk, before they have been individually encoded.

Figure 7:
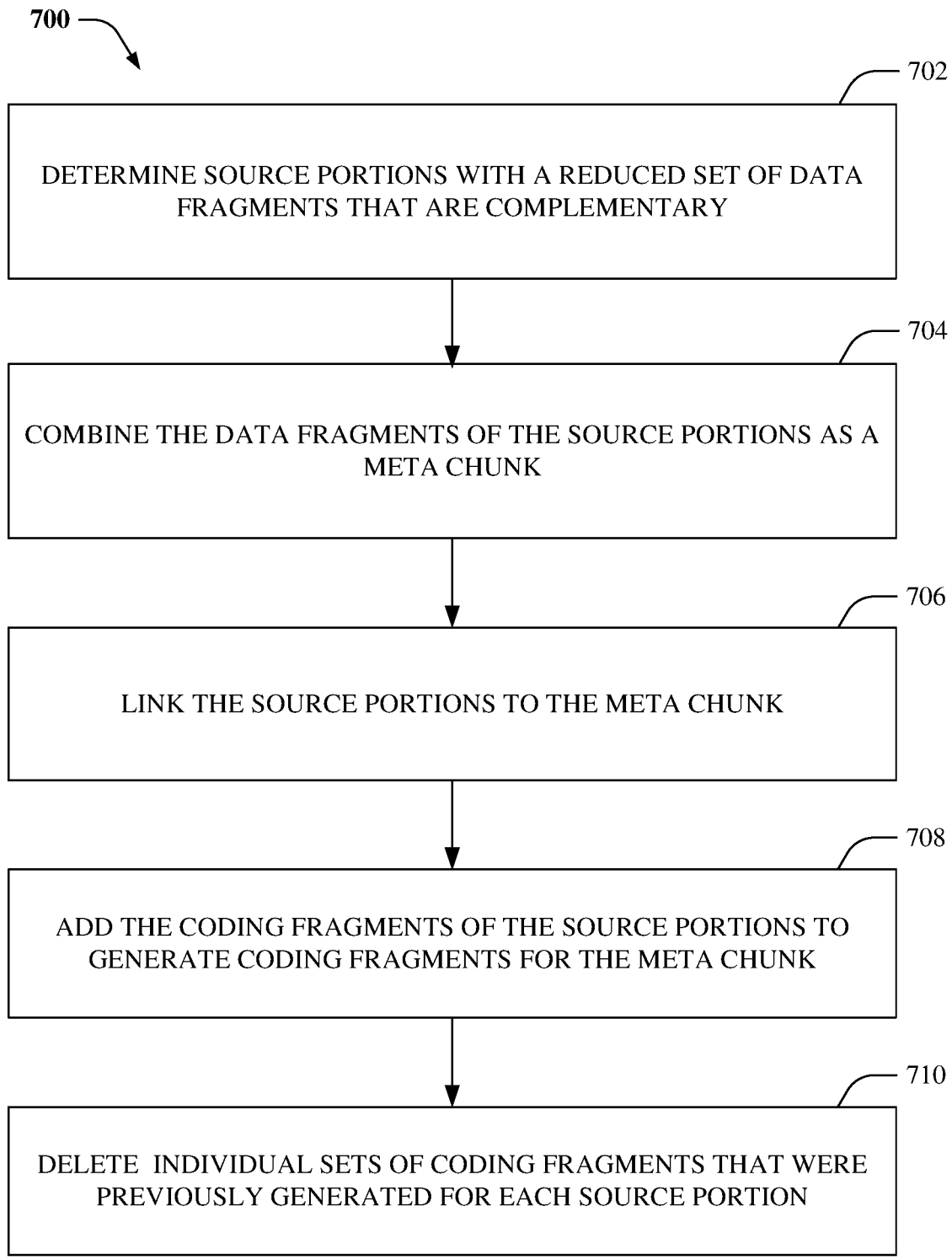
FIG. 7 illustrates an example method for determining a combined protection set for complementary data portions in accordance with an aspect of this disclosure.
Figure 8:
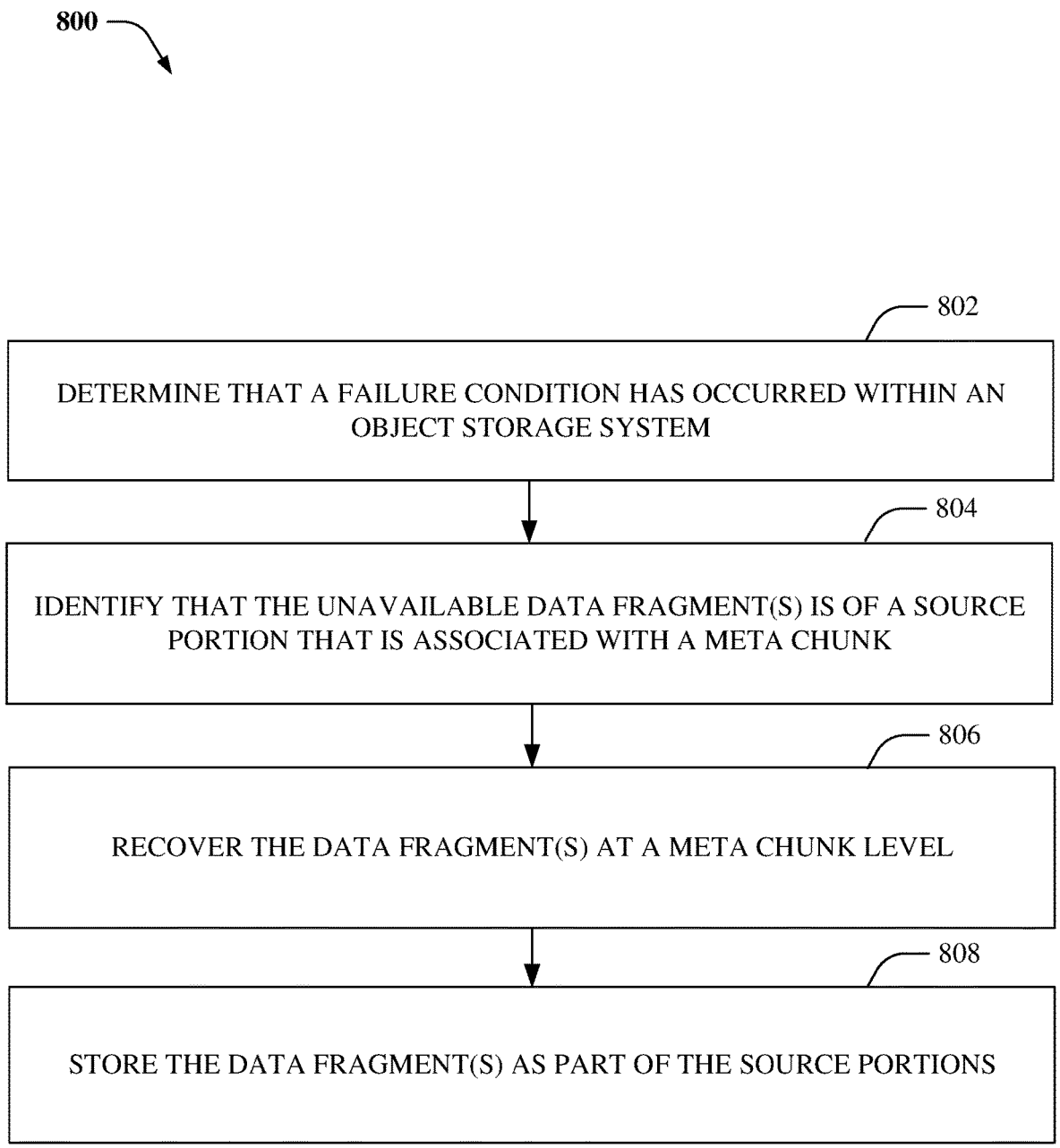
FIG. 8 illustrates an example method for data recovery at a meta chunk level in accordance with an aspect of this disclosure.

FIGS. 7-8 illustrate flow diagrams and/or methods in accordance with the disclosed subject matter. For simplicity of explanation, the flow diagrams and/or methods are depicted and described as a series of acts. It is to be understood and appreciated that the various embodiments are not limited by the acts illustrated and/or by the order of acts, for example acts can occur in various orders and/or concurrently, and with other acts not presented and described herein. Furthermore, not all illustrated acts may be required to implement the flow diagrams and/or methods in accordance with the disclosed subject matter. In addition, those skilled in the art will understand and appreciate that the methods could alternatively be represented as a series of interrelated states via a state diagram or events. Additionally, it should be further appreciated that the methods disclosed hereinafter and throughout this specification are capable of being stored on an article of manufacture to facilitate transporting and transferring such methods to computers. The term article of manufacture, as used herein, is intended to encompass a computer program accessible from any computer-readable device or computer-readable storage/communications media.

Referring now to FIG. 7, there illustrated is an example method 700 for determining a combined protection set for complementary data portions. In an aspect, method 700 can be performed within an object storage system, for example, ECS™. The object storage system can employ chunks for disk capacity management, wherein the disk space is partitioned into a set of blocks of fixed/defined size (e.g., 128 MB) called chunks. All user data can be stored in the chunks and the chunks can be shared between different users. For example, a chunk can comprise fragments of several dozens of user objects. However, one chunk can also comprise fragments of thousands of user objects (e.g., in case of email archives). Chunk content can be modified in an append-only mode. When a chunk becomes full enough, it can be sealed and once sealed, the content of the chunk is immutable. Oftentimes, chunks can be sealed before they are full and/or can have fewer than the maximum/defined number of data fragments (e.g., defined k data fragments for a k+l erasure coding protection protocol). Accordingly, at 702, source portions with a reduced set of data fragments that are complementary can be determined. For example, source portions that do no have data fragments having the same indices can be selected (e.g., based on information stored within a chunk table (or other system data store)). In an aspect, a source portion can comprise a reduced set of data fragments and corresponding coding fragments that have been generated based on erasure coding of the data fragments. In case of distributed erasure coding, the source portion can comprise a reduced set of data chunks and corresponding coding chunks that have been generated based on GEO erasure coding of the data chunks. Although the systems and methods herein are described with respect to data fragments that have been erasure coded, it is noted that the subject embodiments can also be applied to data chunks that are GEO erasure coded.

At 704, data fragments of the source portions can be combined as a meta chunk. In one aspect, physical capacity is not allocated for the meta chunk, but a layout can be created within the new meta chunk. This layout can link the data fragments of the source portions involved to the data fragments of the meta chunk. At 706, the source portions can be linked to the meta chunk. As an example, the metadata (e.g., stored in a chunk table) of the source portions can be updated to include a reference to the meta chunk.

At 708, the coding fragments of the source portions can be added to generate coding fragments for the meta chunk. This set of coding fragments can be utilized to recover data fragments of one or more of the source portions (e.g., subsequent to a failure condition). Further, at 710, the individual sets of coding fragments, that were previously generated by individually encoding each source portion, can be deleted. In one aspect, if the source portions comprise one or more previously generated meta chunks, the previously generated meta chunks can also be deleted. Further, in this example scenario, the source portions of the one or more previously generated meta chunks can be linked to the new meta chunk.

FIG. 8 illustrates is an example method 800 for data recovery at a meta chunk level in accordance with an aspect of this disclosure. At 802 it can be determined that a failure condition has occurred within an object storage system (e.g., ECS™), wherein one or more data fragments have become corrupted, unavailable, and/or lost. At 804, it can be identified that the unavailable data fragment(s) belongs to a source portion that is associated with a meta chunk. For example, metadata associated with the source portion can provide a reference and/or link to a meta chunk that is to be recovered. At 806, the data fragment(s) can be recovered at a meta chunk level. For example, a decoding operation can be performed by employing the coding fragments of the meta chunk. Further, at 808, the recovered data fragment(s) is stored as a part of the source portion.

The systems and methods (e.g., 100-800) disclosed herein provide at least the following non-limiting advantages: (i) reduced capacity overheads during data protection; and (ii) creation of meta chunks does not impact data access because data location is still specified using normal chunks, which remain the same. Use of meta chunks does not require neither resource-demanding verification procedure nor user data location updates; (iii) summation of the coding fragments of complementary source portions allows a simple, efficient, and relatively quicker technique for generating a combined protection set.

Figure 9:
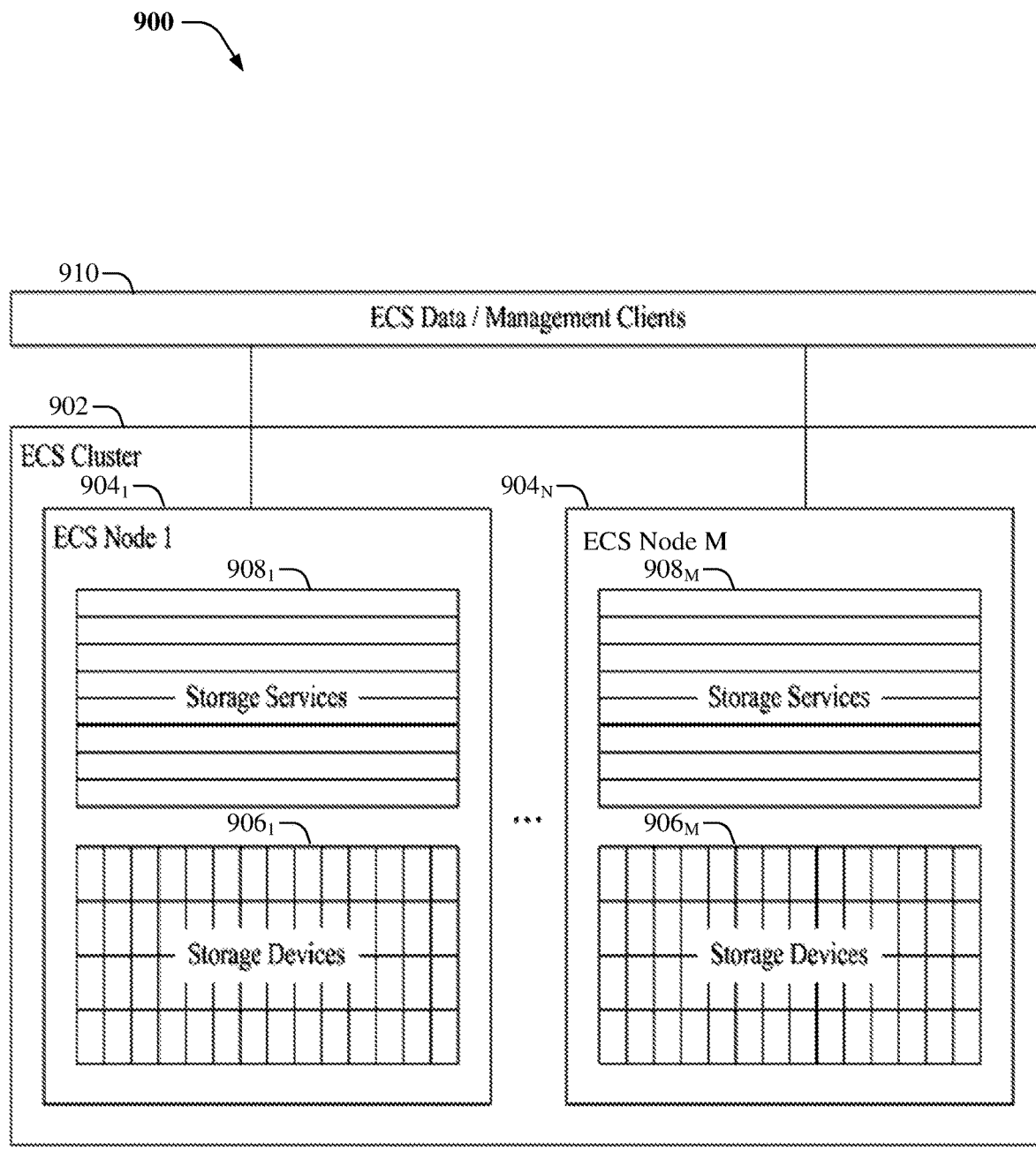
FIG. 9 illustrates high-level architecture of an Elastic Cloud Storage (ECS™) cluster that facilitates combining erasure-coded protection sets.

FIG. 9 illustrates an example high-level architecture 900 of an ECS™ cluster, according to an aspect of the subject disclosure. ECS™ can comprise a software-defined, cloud-scale, object storage platform that combines the cost advantages of commodity infrastructure with the reliability, availability and serviceability of traditional arrays. With ECS™, an organization can deliver scalable and simple public cloud services with the reliability and control of a private-cloud infrastructure. ECS™ provides comprehensive protocol support for unstructured (object and/or file) workloads on a single, cloud-scale storage platform. In an aspect, the ECS™ cluster 902 can comprise multiple nodes $904_1$-$904_M$, wherein M is most any integer. It is noted that the zones 102, and/or zone(s) 118, can comprise at least a portion of ECS™ cluster 902. The nodes $904_1$-$904_M$ can comprise storage devices (e.g. hard drives) $906_1$-$906_M$ and can run a set of services $908_1$-$908_M$. For example, single node that runs ECS™ version 3.0 can manage 20 independent services.

Further, ECS™ data/management clients 910 can be coupled to the nodes $904_1$-$904_M$.

The ECS™ cluster 902 does not protect user data with traditional schemes like mirroring or parity protection. Instead, the ECS™ cluster 902 utilizes a k+m erasure coding protection scheme, wherein a data block (e.g., data chunk) is divided into k data fragments and m coding fragments are created (e.g., by encoding the k data fragments). Encoding is performed in a manner such that the ECS™ cluster 902 can tolerate the loss of any m fragments. As an example, the default scheme for ECS™ is 12+4, i.e. k equals to 12 and m equals to 4; however, the subject disclosure is not limited to this erasure coding protection scheme. When some fragments are lost, the missing fragments are restored via a decoding operation.

In one aspect, the storage services $908_1$-$908_M$ can handle data availability and protection against data corruption, hardware failures, and/or data center disasters. As an example, the storage services $908_1$-$908_M$ can comprise an unstructured storage engine (USE) (not shown), which is a distributed shared service that runs on each node $904_1$-$904_M$, and manages transactions and persists data to nodes. The USE enables global namespace management across geographically dispersed data centers through geo-replication. In an aspect, the USE can write all object-related data (such as, user data, metadata, object location data) to logical containers of contiguous disk space known as chunks. Chunks are open and accepting writes, or closed and not accepting writes. After chunks are closed, the USE can erasure-code them. The USE can write to chunks in an append-only pattern so that existing data is never overwritten or modified. This strategy improves performance because locking and cache validation is not required for I/O operations. All nodes $904_1$-$904_M$ can process write requests for the same object simultaneously while writing to different chunks.

ECS™ continuously monitors the health of the nodes $904_1$-$904_M$, their disks, and objects stored in the cluster. ECS™ disperses data protection responsibilities across the cluster, it can automatically re-protect at-risk objects when nodes or disks fail. When there is a failure of a node or drive in the site, the USE can identify the chunks and/or erasure coded fragments affected by the failure and can write copies of the affected chunks and/or erasure coded fragments to good nodes and disks that do not currently have copies.

Private and hybrid clouds greatly interest customers, who are facing ever-increasing amounts of data and storage costs, particularly in the public cloud space. ECS™ provides a scale-out and geo-distributed architecture that delivers an on-premise cloud platform that scales to exabytes of data with a TCO (Total Cost of Ownership) that's significantly less than public cloud storage. Further, ECS™ provides versatility, hyper-scalability, powerful features, and use of low-cost industry standard hardware.

Figure 10:
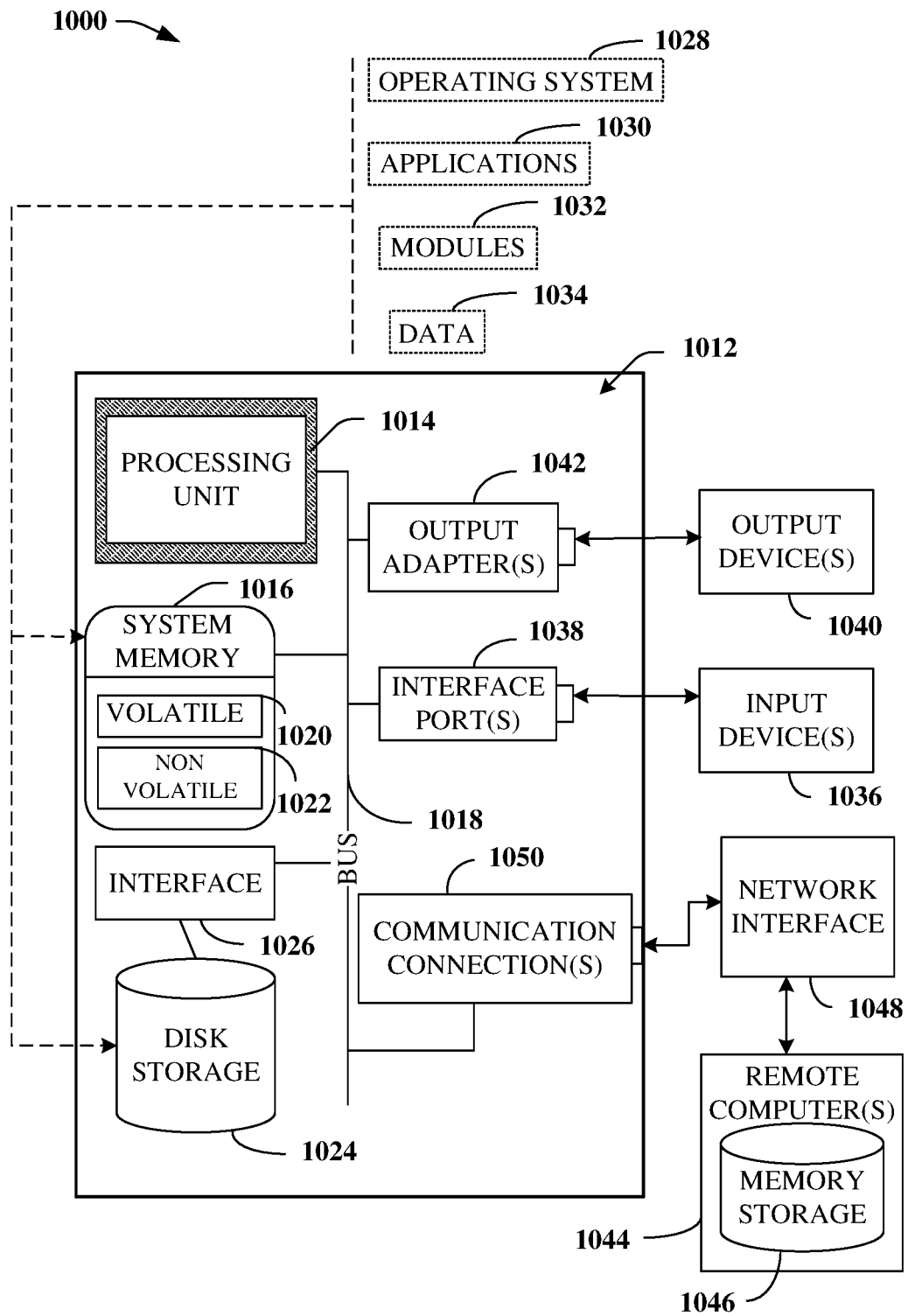
FIG. 10 illustrates a block diagram of an example computer operable to execute the disclosed distributed storage system architecture.

Referring now to FIG. 10, there is illustrated a block diagram of an example computer operable to execute data deletion with distributed erasure coding. In order to provide additional context for various aspects of the disclosed subject matter, FIG. 10 and the following discussion are intended to provide a brief, general description of a suitable computing environment 1000 in which the various aspects of the specification can be implemented. While the specification has been described above in the general context of computer-executable instructions that can run on one or more computers, those skilled in the art will recognize that the specification also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices. The illustrated aspects of the specification can also be practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media and/or communications media, which two terms are used herein differently from one another as follows. Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, (e.g., a carrier wave or other transport mechanism), and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, radio frequency (RF), infrared and other wireless media.

With reference to FIG. 10, a block diagram of a computing system 1000 operable to execute the disclosed systems and methods is illustrated, in accordance with an embodiment. Computer 1012 comprises a processing unit 1014, a system memory 1016, and a system bus 1018. As an example, the component(s), server(s), client(s), node(s), cluster(s), system(s), zone(s), module(s), agent(s), engine(s), manager(s), and/or device(s) disclosed herein with respect to systems 100-600 and 900 can each include at least a portion of the computing system 1000. System bus 1018 couples system components comprising, but not limited to, system memory 1016 to processing unit 1014. Processing unit 1014 can be any of various available processors. Dual microprocessors and other multiprocessor architectures also can be employed as processing unit 1014.

System bus 1018 can be any of several types of bus structure(s) comprising a memory bus or a memory controller, a peripheral bus or an external bus, and/or a local bus using any variety of available bus architectures comprising, but not limited to, industrial standard architecture (ISA), micro-channel architecture (MSA), extended ISA (EISA), intelligent drive electronics (IDE), VESA local bus (VLB), peripheral component interconnect (PCI), card bus, universal serial bus (USB), advanced graphics port (AGP), personal computer memory card international association bus (PCMCIA), Firewire (IEEE 1394), small computer systems interface (SCSI), and/or controller area network (CAN) bus used in vehicles.

System memory 1016 comprises volatile memory 1020 and nonvolatile memory 1022. A basic input/output system (BIOS), comprising routines to transfer information between elements within computer 1012, such as during start-up, can be stored in nonvolatile memory 1022. By way of illustration, and not limitation, nonvolatile memory 1022 can comprise ROM, PROM, EPROM, EEPROM, or flash memory. Volatile memory 1020 comprises RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1012 also comprises removable/non-removable, volatile/non-volatile computer storage media. FIG. 10 illustrates, for example, disk storage 1024. Disk storage 1024 comprises, but is not limited to, devices like a magnetic disk drive, floppy disk drive, tape drive, Jaz drive, Zip drive, LS-100 drive, flash memory card, or memory stick. In addition, disk storage 1024 can comprise storage media separately or in combination with other storage media comprising, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1024 to system bus 1018, a removable or non-removable interface is typically used, such as interface 1026.

It is to be appreciated that FIG. 10 describes software that acts as an intermediary between users and computer resources described in suitable operating environment 1000. Such software comprises an operating system 1028. Operating system 1028, which can be stored on disk storage 1024, acts to control and allocate resources of computer system 1012. System applications 1030 take advantage of the management of resources by operating system 1028 through program modules 1032 and program data 1034 stored either in system memory 1016 or on disk storage 1024. It is to be appreciated that the disclosed subject matter can be implemented with various operating systems or combinations of operating systems.

A user can enter commands or information into computer 1012 through input device(s) 1036. Input devices 1036 comprise, but are not limited to, a pointing device such as a mouse, trackball, stylus, touch pad, keyboard, microphone, joystick, game pad, satellite dish, scanner, TV tuner card, digital camera, digital video camera, web camera, cellular phone, user equipment, smartphone, and the like. These and other input devices connect to processing unit 1014 through system bus 1018 via interface port(s) 1038. Interface port(s) 1038 comprise, for example, a serial port, a parallel port, a game port, a universal serial bus (USB), a wireless based port, e.g., Wi-Fi, Bluetooth®, etc. Output device(s) 1040 use some of the same type of ports as input device(s) 1036.

Thus, for example, a USB port can be used to provide input to computer 1012 and to output information from computer 1012 to an output device 1040. Output adapter 1042 is provided to illustrate that there are some output devices 1040, like display devices, light projection devices, monitors, speakers, and printers, among other output devices 1040, which use special adapters. Output adapters 1042 comprise, by way of illustration and not limitation, video and sound devices, cards, etc. that provide means of connection between output device 1040 and system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. Remote computer(s) 1044 can be a personal computer, a server, a router, a network PC, a workstation, a microprocessor based appliance, a peer device, or other common network node and the like, and typically comprises many or all of the elements described relative to computer 1012.

For purposes of brevity, only a memory storage device 1046 is illustrated with remote computer(s) 1044. Remote computer(s) 1044 is logically connected to computer 1012 through a network interface 1048 and then physically and/or wirelessly connected via communication connection 1050. Network interface 1048 encompasses wire and/or wireless communication networks such as local-area networks (LAN) and wide-area networks (WAN). LAN technologies comprise fiber distributed data interface (FDDI), copper distributed data interface (CDDI), Ethernet, token ring and the like. WAN technologies comprise, but are not limited to, point-to-point links, circuit switching networks like integrated services digital networks (ISDN) and variations thereon, packet switching networks, and digital subscriber lines (DSL).

Communication connection(s) 1050 refer(s) to hardware/software employed to connect network interface 1048 to bus 1018. While communication connection 1050 is shown for illustrative clarity inside computer 1012, it can also be external to computer 1012. The hardware/software for connection to network interface 1048 can comprise, for example, internal and external technologies such as modems, comprising regular telephone grade modems, cable modems and DSL modems, wireless modems, ISDN adapters, and Ethernet cards.

The computer 1012 can operate in a networked environment using logical connections via wired and/or wireless communications to one or more remote computers, cellular based devices, user equipment, smartphones, or other computing devices, such as workstations, server computers, routers, personal computers, portable computers, microprocessor-based entertainment appliances, peer devices or other common network nodes, etc. The computer 1012 can connect to other devices/networks by way of antenna, port, network interface adaptor, wireless access point, modem, and/or the like.

The computer 1012 is operable to communicate with any wireless devices or entities operatively disposed in wireless communication, e.g., a printer, scanner, desktop and/or portable computer, portable data assistant, communications satellite, user equipment, cellular base device, smartphone, any piece of equipment or location associated with a wirelessly detectable tag (e.g., scanner, a kiosk, news stand, restroom), and telephone. This comprises at least Wi-Fi and Bluetooth® wireless technologies. Thus, the communication can be a predefined structure as with a conventional network or simply an ad hoc communication between at least two devices.

The computing system 1000 is operable to communicate with any wireless devices or entities operatively disposed in wireless communication, e.g., desktop and/or portable computer, server, communications satellite, etc. This includes at least Wi-Fi and Bluetooth® wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, n, etc.) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 5 GHz radio band at a 54 Mbps (802.11a) data rate, and/or a 2.4 GHz radio band at an 11 Mbps (802.11b), a 54 Mbps (802.11g) data rate, or up to a 600 Mbps (802.11n) data rate for example, or with products that contain both bands (dual band), so the networks can provide real-world performance similar to the basic 10BaseT wired Ethernet networks used in many offices.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory in a single machine or multiple machines. Additionally, a processor can refer to an integrated circuit, a state machine, an application specific integrated circuit (ASIC), a digital signal processor (DSP), a programmable gate array (PGA) including a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units. One or more processors can be utilized in supporting a virtualized computing environment. The virtualized computing environment may support one or more virtual machines representing computers, servers, or other computing devices. In such virtualized virtual machines, components such as processors and storage devices may be virtualized or logically represented. In an aspect, when a processor executes instructions to perform "operations", this could include the processor performing the operations directly and/or facilitating, directing, or cooperating with another device or component to perform the operations In the subject specification, terms such as "data store," data storage," "database," "cache," and substantially any other information storage component relevant to operation and functionality of a component, refer to "memory components," or entities embodied in a "memory" or components comprising the memory. It is noted that the memory components, or computer-readable storage media, described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

The illustrated aspects of the disclosure can be practiced in distributed computing environments where certain tasks are performed by remote processing devices that are linked through a communications network. In a distributed computing environment, program modules can be located in both local and remote memory storage devices.

The systems and processes described above can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders that are not all of which may be explicitly illustrated herein.

As used in this application, the terms "component," "module," "system," "interface," "cluster," "server," "node," or the like are generally intended to refer to a computer-related entity, either hardware, a combination of hardware and software, software, or software in execution or an entity related to an operational machine with one or more specific functionalities. For example, a component can be, but is not limited to being, a process running on a processor, a processor, an object, an executable, a thread of execution, computer-executable instruction(s), a program, and/or a computer. By way of illustration, both an application running on a controller and the controller can be a component. One or more components may reside within a process and/or thread of execution and a component may be localized on one computer and/or distributed between two or more computers. As another example, an interface can include input/output (I/O) components as well as associated processor, application, and/or API components.

Furthermore, the terms "user," "consumer," "client," and the like are employed interchangeably throughout the subject specification, unless context warrants particular distinction(s) among the terms. It is noted that such terms can refer to human entities or automated components/devices supported through artificial intelligence (e.g., a capacity to make inference based on complex mathematical formalisms), which can provide simulated vision, sound recognition and so forth.

Further, the various embodiments can be implemented as a method, apparatus, or article of manufacture using standard programming and/or engineering techniques to produce software, firmware, hardware, or any combination thereof to control a computer to implement one or more aspects of the disclosed subject matter. An article of manufacture can encompass a computer program accessible from any computer-readable device or computer-readable storage/communications media. For example, computer readable storage media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Of course, those skilled in the art will recognize many modifications can be made to this configuration without departing from the scope or spirit of the various embodiments.

Artificial intelligence based systems, e.g., utilizing explicitly and/or implicitly trained classifiers, can be employed in connection with performing inference and/or probabilistic determinations and/or statistical-based determinations as in accordance with one or more aspects of the disclosed subject matter as described herein. For example, an artificial intelligence system can be used to dynamically perform operations as described herein.

A classifier can be a function that maps an input attribute vector, x=(x1, x2, x3, x4, xn), to a confidence that the input belongs to a class, that is, f(x)=confidence (class). Such classification can employ a probabilistic and/or statistical-based analysis (e.g., factoring into the analysis utilities and costs) to infer an action that a user desires to be automatically performed. In the case of communication systems, for example, attributes can be information received from access points, servers, components of a wireless communication network, etc., and the classes can be categories or areas of interest (e.g., levels of priorities). A support vector machine is an example of a classifier that can be employed. The support vector machine operates by finding a hypersurface in the space of possible inputs, which the hypersurface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein can also be inclusive of statistical regression that is utilized to develop models of priority.

In accordance with various aspects of the subject specification, artificial intelligence based systems, components, etc. can employ classifiers that are explicitly trained, e.g., via a generic training data, etc. as well as implicitly trained, e.g., via observing characteristics of communication equipment, e.g., a server, etc., receiving reports from such communication equipment, receiving operator preferences, receiving historical information, receiving extrinsic information, etc. For example, support vector machines can be configured via a learning or training phase within a classifier constructor and feature selection module. Thus, the classifier(s) can be used by an artificial intelligence system to automatically learn and perform a number of functions.

In addition, the word "example" or "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What has been described above includes examples of the present specification. It is, of course, not possible to describe every conceivable combination of components or methods for purposes of describing the present specification, but one of ordinary skill in the art may recognize that many further combinations and permutations of the present specification are possible. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system, comprising:
a processor; and
a non-transitory memory that stores executable instructions that, when executed by the processor, facilitate performance of operations, comprising:
selecting source chunks stored within a storage system that are determined to have fewer than a defined number of data fragments, wherein the source chunks are divided into indexed data fragments, and wherein the indexed data fragments are erasure-coded to generate source coding fragments;
based on combining the source chunks, generating a meta chunk; and
in response to verifying that the source chunks do not have data fragments with a common index, adding the source coding fragments to generate combined coding fragments associated with the meta chunk.

2. The system of claim 1, wherein the operations further comprise:
linking the source chunks to the meta chunk.

3. The system of claim 2, wherein the linking comprises updating metadata associated with a source chunk of the source chunks to comprise reference data indicative of the meta chunk.

4. The system of claim 1, wherein the operations further comprise:
storing the combined coding fragments; and
subsequent to the storing, deleting the source coding fragments.

5. The system of claim 1, wherein the meta chunk is a first meta chunk and the source chunks are first source chunks, wherein the first source chunks comprise a second meta chunk that has been generated based on a combination of second source chunks, and wherein the second source chunks are determined to have fewer than the defined number of data fragments.

6. The system of claim 1, wherein a source chunk of the source chunks is determined to have been sealed prematurely.

7. The system of claim 1, wherein the combined coding fragments are employable to recover at least a portion of the indexed data fragments.

8. The system of claim 1, wherein the indexed data fragments comprise indices that are assigned to increase a probability that the two or more of the source chunks do not have the data fragments with the common index.

9. The system of claim 1, wherein physical capacity is not allocated for the meta chunk.

10. The system of claim 1, wherein the storage system comprises a geographically-distributed object storage system.

11. A method, comprising:
selecting, by a system comprising a processor, source chunks from chunks of an object storage system, wherein the source chunks are determined to have fewer data fragments than remaining of the chunks other than the source chunks, wherein the data fragments do not have common indices that are utilized for erasure coding the data fragments, and wherein the erasure coding the data fragments results in generation of source coding fragments;
determining a meta chunk that represents a combination of the data fragments; and
based on a summation of the source coding fragments, determining combined coding fragments for the source chunks at a meta chunk level, wherein the combined coding fragments are to be employed to recover at least a portion of the data fragments during a failure condition.

12. The method of claim 11, further comprising:
assigning respective indices to first data fragments, of the data fragments, that are associated with a source chunk of the source chunks, wherein the assigning comprises assigning the respective indices to increase a likelihood that the data fragments do not have the common indices.

13. The method of claim 11, further comprising:
storing reference data that links the source chunks to the meta chunk.

14. The method of claim 13, further comprising:
in response to determining that the failure condition has been satisfied, determining, based on the reference data, the meta chunk linked to at least the portion of the source chunks.

15. The method of claim 14, further comprising:
recovering at least the portion of the source chunks based on performing a decoding operation at the meta chunk level.

16. The method of claim 11, further comprising:
subsequent to the determining the combined coding fragments, deleting source coding fragments.

17. A non-transitory computer-readable storage medium comprising instructions that, in response to execution, cause a server device comprising a processor to perform operations, comprising:
encoding chunks of data stored in an object storage system, wherein the chunks comprise data fragments that have been assigned respective indices, and wherein the encoding comprises combining, based on the respective indices, the data fragments with corresponding encoding coefficients to generate respective coding fragments;
combining a group of the chunks to generate a meta chunk, wherein the group of the chunks are determined not to have more than a defined number of data fragments, and wherein the group of the chunks are determined not to have data fragments having common indices; and
based on a summation of a group of the coding fragments that correspond to the group of the chunks, determining meta chunk coding fragments that are to be employed to recover at least a portion of the group of the chunks during a failure condition.

18. The non-transitory computer-readable storage medium of claim 17, wherein the coding fragments are meta chunk coding fragments, and the operations further comprise:
subsequent to the determining the meta chunk coding fragments, deleting the group of the coding fragments.

19. The non-transitory computer-readable storage medium of claim 17, wherein the operations further comprise:
determining reference data that links the group of the chunks to the meta chunk.

20. The non-transitory computer-readable storage medium of claim 19, wherein the operations further comprise:
updating metadata associated with the group of the chunks the reference data.

\* \* \* \* \*